(12) United States Patent
Adelerhof

(10) Patent No.: US 6,633,462 B2
(45) Date of Patent: Oct. 14, 2003

(54) MAGNETORESISTIVE ANGLE SENSOR HAVING SEVERAL SENSING ELEMENTS

(75) Inventor: Derk Jan Adelerhof, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 211 days.

(21) Appl. No.: 09/864,130

(22) Filed: May 24, 2001

(65) Prior Publication Data

US 2002/0006017 A1 Jan. 17, 2002

(30) Foreign Application Priority Data

Jul. 13, 2000 (EP) .............................. 00202484

(51) Int. Cl.[7] .............................................. G11B 5/127
(52) U.S. Cl. .................... 360/315; 360/313; 324/207.21
(58) Field of Search ................................ 360/313, 314, 360/315, 316; 324/202, 252, 207.12, 207.21, 207.22, 207.23, 207.24, 207.25; 338/32 R

(56) References Cited

U.S. PATENT DOCUMENTS

| | | | | | |
|---|---|---|---|---|---|
| 5,621,320 A | * | 4/1997 | Yokotani et al. | ............ | 324/252 |
| 6,011,390 A | * | 1/2000 | Loreit et al. | ............ | 324/207.21 |
| 6,104,187 A | * | 8/2000 | Marx et al. | ............ | 324/207.21 |
| 6,191,578 B1 | * | 2/2001 | Bezinge et al. | ........ | 324/207.21 |
| 6,304,074 B1 | * | 10/2001 | Waffenschmidt | ............ | 324/202 |
| 6,433,535 B1 | * | 8/2002 | Marx et al. | ............ | 324/207.21 |
| 6,433,537 B1 | * | 8/2002 | Petersen | ................ | 324/207.24 |

FOREIGN PATENT DOCUMENTS

DE          4438715 C1     5/1996

* cited by examiner

Primary Examiner—David L. Ometz
(74) Attorney, Agent, or Firm—Steven R. Biren

(57) ABSTRACT

A magnetoresistive angular sensor (1) is provided which determines a magnetic field direction. A high angular accuracy over a wide range of magnetic field strengths is obtained. The magnetoresistive angular sensor comprises a main sensing element (2) which is electrically connected to a first correction sensing element (6) with a first reference magnetization axis (9) and a second correction sensing element (8) with a second reference magnetization axis (10), the first (9) and the second (10) reference magnetization axes making correction angles Θ between 5° and 85° of opposite sign with the main reference axis (3).

8 Claims, 6 Drawing Sheets

MAGNETORESISTIVE ANGLE SENSOR HAVING SEVERAL SENSING ELEMENTS

The invention relates to a magnetoresistive sensor, comprising a main sensing element with a main reference magnetization axis, for determining an angle between the main reference magnetization axis and a magnetic field direction.

The invention further relates to a method of manufacturing a magnetoresistive sensor, comprising a main sensing element, including a main reference magnetization axis, for determining an angle between the main reference magnetization axis and a magnetic field direction.

Such a magnetoresistive sensor and a method of manufacturing are known from the paper Euro sensors XIII, The 13th European Conference on Solid State Transducers, Sep. 12–15, 1999, The Hague, The Netherlands, pages 589–596; "Robust giant magnetoresistance sensors", K.-M. H. Lenssen et al.

Magnetoresistance is the phenomenon whereby the resistance of certain materials changes when a magnetic field is placed on these materials. Ferromagnetic magnetoresistance angle sensors are widely used in non-contact angular position sensors in harsh environments like in automobiles or industry. In general these sensors are insensitive to wear and contamination. When operated in a sufficiently strong, saturating magnetic field, their susceptibility for variations in the field strength is low, with respect either to stray fields such as the earth's magnetic field or other magnetic fields. This makes this kind of angle sensors very tolerant against variations in the distance between the magnetoresistance sensor itself and a bias magnet that generates the magnetic field.

Different kinds of ferromagnetic magnetoresistive sensors are known: anisotropic magnetoresistance (AMR) sensors, giant magnetoresistance (GMR) sensors and tunneling magnetoresistance (TMR) sensors.

AMR occurs in ferrous materials. It is a change in resistance when a magnetic field is applied which is not parallel to a current flow in a thin strip of a ferrous material. The resistance has a maximum value when the magnetic field applied is perpendicular to the current flow.

AMR sensors are typically made of single layer thin films of Ni—Fe structured like a meander. The resistance of these sensors depends on the angle $\Theta$ between a current through the strips of the meander and the magnetization direction of Ni—Fe according to $R(\Theta)=R(0°)+\Delta R(1-\cos 2\Theta)/2$.

GMR and TMR sensors are both multilayer configurations with at least two layers. In spin valve GMR and TMR angle sensors one of the two layers is either pinned by exchange biasing to an anti-ferromagnet (AF) layer, of e.g. Ir—Mn, Fe—Mn, or NiO, or consists of an artificial anti-ferromagnet (AAF) formed by for instance CoFe/Ru/CoFe exchange biased by an AF layer. The direction of the magnetization of the said magnetic layer defines the main reference magnetization axis. The other layer (the free layer) is made as soft as possible to follow an external magnetic field direction.

In GMR or TMR sensors the resistance depends on the angle $\Theta$ between the magnetization direction of the pinned magnetic layer, which direction defines the main reference magnetization axis, and the magnetization direction of the soft magnetic layer according to $R(\Theta)=R(0°)+\Delta R(1-\cos\Theta)/2$.

The magnetoresistive sensors known from said paper are very suitable for analog angle sensing because of their intrinsic angle dependence.

A disadvantage of the known magnetoresistive sensor is that at relatively low magnetic fields, the output signal deviates from the ideal sinusoidal output signal. The distortion in the sinusoidal output signal occurs in both AMR sensors and GMR sensors and is to a large extent due to the anisotropy of the soft magnetic material, e.g. Ni—Fe, as will be explained hereafter.

In AMR sensors the magnetization direction is determined by a balance between the uniaxial anisotropy of the Ni—Fe material of the strips and the external magnetic field. The uniaxial anisotropy induced during deposition is usually a combination of crystal anisotropy induced during deposition and shape anisotropy. Without an external magnetic field being applied, the magnetization direction is in either one of the two directions along the easy axis set by the anisotropy. In a strong, saturating magnetic field the magnetization direction approaches the direction of the applied magnetic field. A sinusoidal resistance variation is obtained in rotating magnetic fields. At relatively low fields, the magnetization direction deviates considerably from the direction of the applied field which induces distortion in the periodic output signal of an angle sensor based on AMR. Low operation fields, however, are of interest because cheap ferroxdure bias magnets can be used to generate these fields. AMR sensors only offer high angular accuracy in strong fields of about 100 kA/m or larger, which can only be generated by expensive SmCo or NdFeB magnets.

In spin valve GMR and TMR angle sensors the soft magnetic layer usually has a finite anisotropy and is coupled to the pinned layer by orange-peel coupling and magnetostatic coupling. A minimum magnetic field strength is required to overcome the coupling and anisotropy in order to impose the external field direction to the magnetization direction of the free layer. Strong fields, however, also affect the magnetization direction of the pinned layer or of the AAF, which serves as a reference direction for the GMR or TMR element. In practice, it is impossible to fully saturate the free layer, without affecting the magnetization direction of the pinned layer or AAF in all field directions. This limits the accuracy that can be obtained in GMR based angular position sensors.

It is an object of the present invention to provide a magnetoresistive sensor of the kind mentioned in the opening paragraph which sensor is easy to realize and is able to sense the angular direction of a magnetic field accurately in a wide range of magnetic field strengths.

According to the invention, this object is achieved in that the main sensing element is electrically connected to a first correction sensing element with a first reference magnetization axis and a second correction sensing element with a second reference magnetization axis, the first and the second reference magnetization axes making correction angles $\Theta$ between 5° and 85° of opposite sign with the main reference axis. During use, the sinusoidal output signal of the main sensor includes a distortion which is to a large extent due to the anisotropy in the soft magnetic material, of for instance Ni—Fe. Especially at low magnetic fields, the magnetization does not exactly follow the external magnetic field direction. The error in the output from the main sensor is corrected by adding two correction-sensing elements. The reference magnetization directions of the first and second sensing elements are arranged at a correction angle with respect to the main reference magnetization direction of the main sensing element, for instance at a positive and negative angle thereto on the respective side of the main sensing element. For an AMR sensing element preferably the bias current of each correcting element is placed at an angle compared to the bias current of the main sensing element by physically angling the correcting elements with respect to the main sensing element. For a magnetoresitive GMR or TMR sensing element preferably the bias magnetization direction of each correcting element is placed at an angle with respect to the bias magnetization direction of the main sensing element. The introduction of the correction sensing elements increases the accuracy of determining the external field direction over a wide range of magnetic field strengths.

For an unambiguous determination of the external magnetic field direction over 180° for AMR and 360° for GMR or TMR magnetoresistive sensors, two magnetoresistive sensors according to the invention of the same type are necessary. For this reason the invention also relates to a sensor arrangement as defined in claim 2. The main reference magnetization axis of the two main sensing elements is mutually rotated over a quarter period of a periodic output signal of the main sensing element. In order to correct the output of each main sensing element, it is essential to know the error signal. The error signal has twice the period of the period of the output signal of the two main sensing elements. The error signal can at least partly be eliminated by adding a first and a second correction-sensing element on each side of each of the main sensing elements. The correction angles between the reference magnetization directions of the first and second sensing elements and the main reference magnetization direction are chosen as ⅛ period for each correction sensing element. Almost complete cancellation of the error signal occurs, because the output signal of the correction sensing elements has the same period as the error signal and is shifted over half a period of the error signal. An embodiment of the sensor arrangement according to the invention is defined in claim 3.

Second order or higher angular correction is preferably also provided, for example, the magnetoresistive sensor in accordance with an embodiment of the present invention may comprise a plurality of second order correction or higher order correction elements, electrically interconnected on either side of the main sensing element. The additional correction sensing elements have reference magnetization axis making angles of opposite sign with respect to the main reference magnetization axis of substantially n. 1/16 of the periodic output signal of the first main sensor, where n is an integer.

The present invention also includes a magnetoresistive Wheatstone bridge type angular sensor device, which may comprise four magnetoresitive sensing elements provided with at least first order angular correction elements, as described above. Such an arrangement is defined in claim 5. The advantage of a Wheatstone bridge angular sensor device is that temperature effects on the resistance are suppressed.

It is a further object of the present invention to provide a method of manufacturing a magnetoresistive sensor, being able to sense the angular direction of a magnetic field accurately in a wide range of magnetic field strengths, the method being easily feasible.

The further object of the invention is achieved by the method as defined in claim 6.

The present invention includes, for instance, forming the relevant angles by locally heating each correcting element above the blocking temperature of the exchange biasing in a sufficiently strong biasing magnetic field having a bias direction at the angle intended for the correction element. A preferred embodiment of the method according to the invention is defined in claim 7.

Preferably, the local heating is done by passing an electric current through the first or second sensing element. Alternatively the local heating can be done by means of a laser.

The above magnetoresistive sensors or sensor arrangements may be fabricated on a single chip using a single mask while still providing correction for the distortion in the output signal. The fabrication is easy and cheap.

Other features and advantages of the present invention will become apparent from the following detailed description, taken in conjunction with the accompanying drawings, which illustrate, by way of example, the principles of the invention.

The present invention will be described with reference to certain drawings and to certain embodiments but the present invention is not limited thereto.

Figure 1:
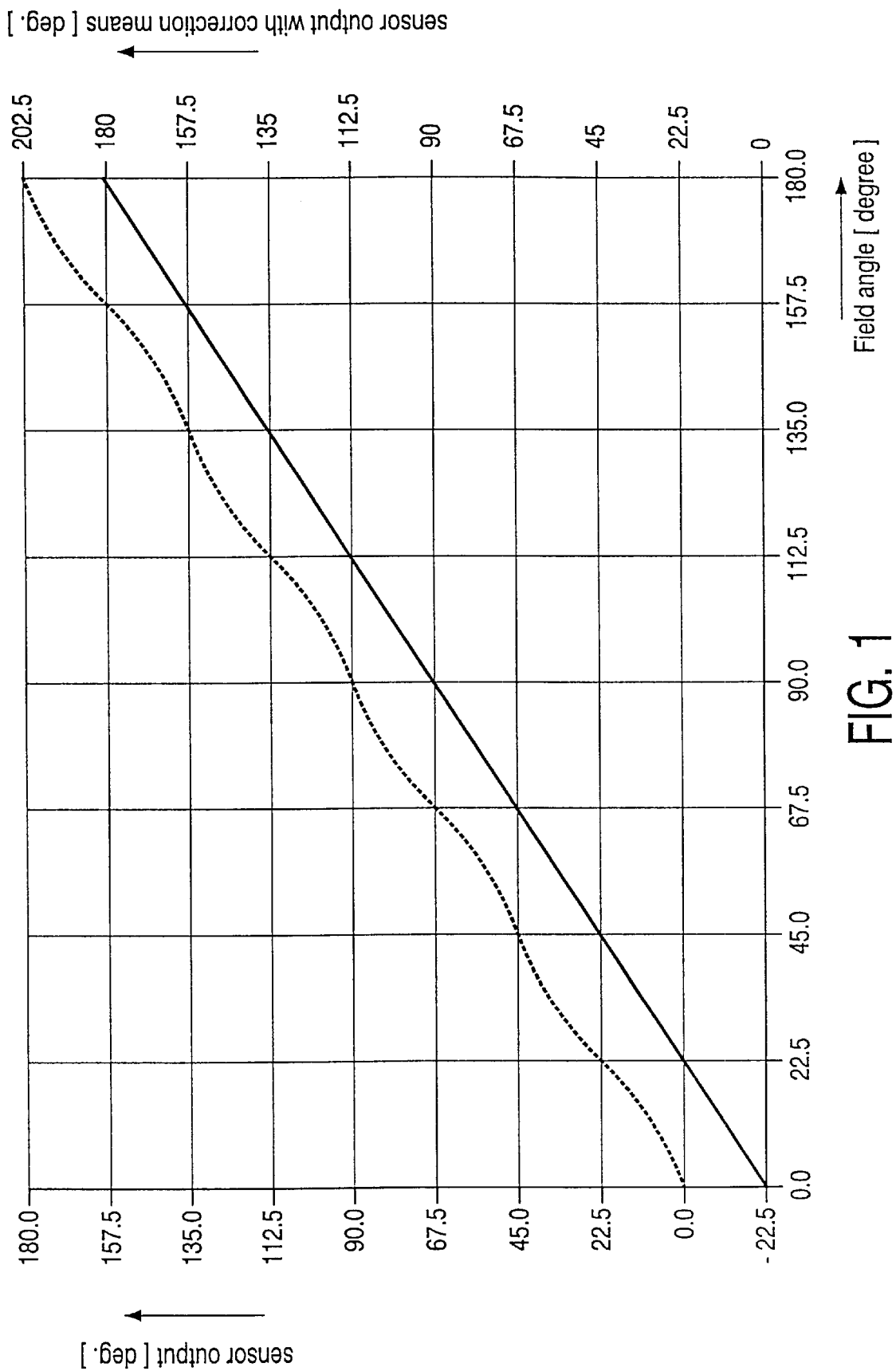
FIG. 1 shows an angle sensed by a magnetoresistive sensor based on the AMR effect as a function of the direction of an applied magnetic field of low magnitude, the upper curve—dotted line—showing the results for an uncorrected angular sensor and the lower curve showing the results for an embodiment of the sensor according to the invention.

FIG. 1 shows the measured angle (the Y axis on the left) of a conventional AMR based angular sensor (dotted line) as a function of the angular direction of an applied magnetic field. The magnetic field may be applied by a magnet which rotates relative to the sensor. The applied field is relatively low and is too low to saturate the sensor; this effect is reflected in an observable non-linear curve.

Figure 2:
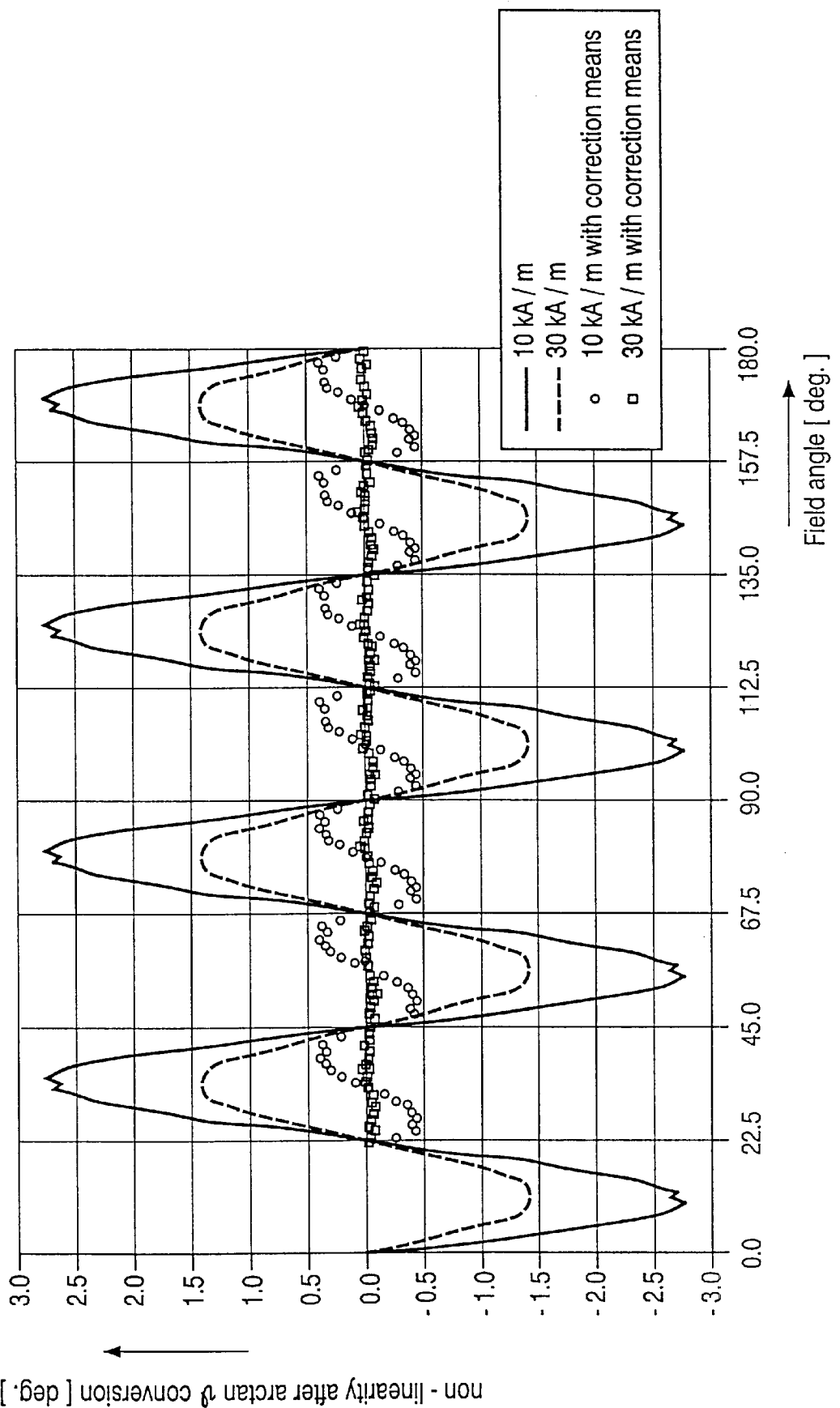
FIG. 2 shows the error signal of two AMR Wheatstone bridge configurations mutually rotated over 45° in comparison with the Wheatstone bridge configurations having correction means in accordance with the present invention.

FIG. 2 shows the degree of non-linearity (i.e. the error signal) measured at two magnetic field strengths (10 kA/m and 30 kA/m) for two conventional AMR Wheatstone bridge type angular sensor devices with an anisotropy of 3 kJ/m$^3$ positioned under 45° relative to each other. The non-linearity is defined as the difference between the ratio of the two actual output signals of the AMR Wheatstone bridge type angular sensor devices and the best fitting straight line after arctanΘ conversion. The error signal is calculated therefore by subtracting the output from the best-fit straight line. It can be seen that the degree of non-linearity reduces for stronger magnetic fields (dotted line compared to full line). The non-linearity of the output signal of the two non-corrected Wheatstone bridge type angular sensor devices mutually rotated over 45 degrees is roughly sinusoidal with a period of 45° degrees which is a quarter of the periodicity of the output signal of one Wheatstone bridge type angular sensor device. The correction sensing elements at least partly eliminate the error in the measured angle to below 1°.

Figure 3:
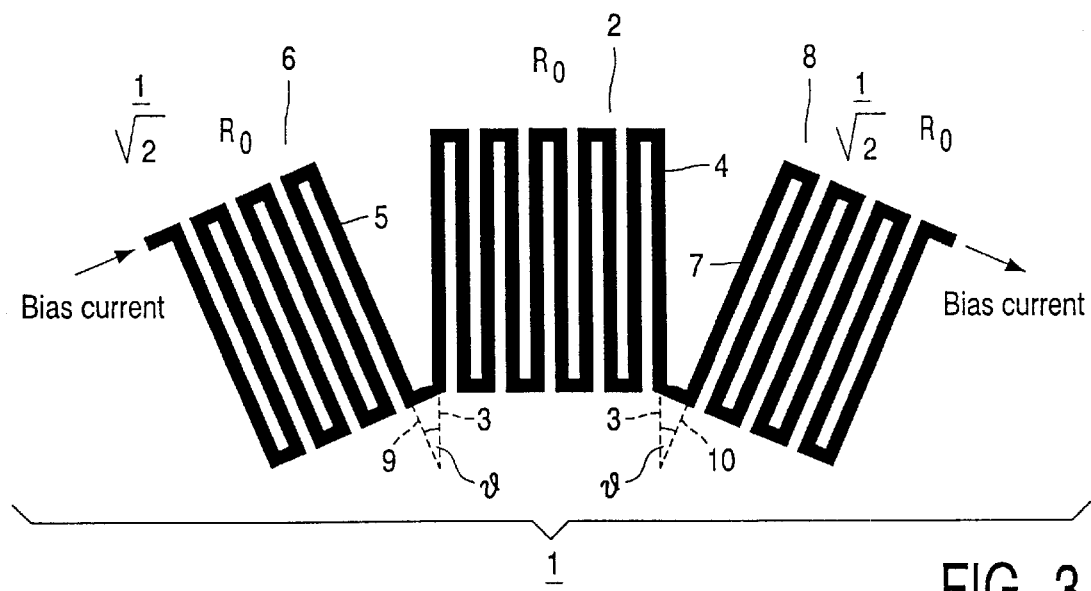
FIG. 3 illustrates an AMR embodiment of the sensor according to the present invention.

In accordance with an embodiment of the sensor according to the present invention, correcting sensor elements 6, 8 are added on either side of the main sensing element 2 of an AMR angular sensor 1 as shown schematically in FIG. 3. The main sensing element 2 is provided with a plurality of elongate ferromagnetic strips 4, e.g. Ni—Fe, in the form of a 180° meander (or switch-back meander) providing an element resistance of $R_0$. The output of the sensing AMR element 2 is added to the output of two additional correction elements 6, 8, one located on each side of the sensing element 2 and electrically connected in series to the sensor element 2 as shown in FIG. 3. Each correcting element 6, 8 may be constructed from elongate ferromagnetic elements 5 and 7, respectively as described for the main sensing element 2. The correction elements 6, 8 are located at an angle Θ with respect to the first main sensing element 2 in such a way as to compensate at least partly for non-linearity in the output signal of the main sensing element 2. For example, the correction element 6 on one side (further mentioned the trailing side) of the sensing element 2 is rotated over an angle of −22.5 degrees and the correction element on the other side (further mentioned the leading side) is rotated over an angle of 22.5 degrees relative to the main sensing element 2. The terms leading side and trailing side relate to the fact that as the angular sensor 1 is rotated relative to a magnetic field, the correction element 8 leads the sensing element 2 and the correction element 6 trails.

The output signal of the correction sensing elements 6, 8 is shifted over half a period of the error signal of the main sensing element 2. The summation of these angularly displaced signals with the output of the main sensing element 2 results in at least partial cancellation of the non-linearity in the output of sensor 1. In order to correct the amplitude of the error signal, the correction elements 6, 8 have a resistance $1/\sqrt{2}\,R_0$ of the resistance $R_0$ of the main sensing element 2.

The improvement in linearity is shown in FIG. 1 (solid line, refer to Y-axis on the right side of the figure) and in FIG. 2 (round dotted and square dotted lines). Some loss of overall output magnitude is obtained, e.g. the output signal magnitude reduces to about 80% of the output signal magnitude before correction.

Figure 4:
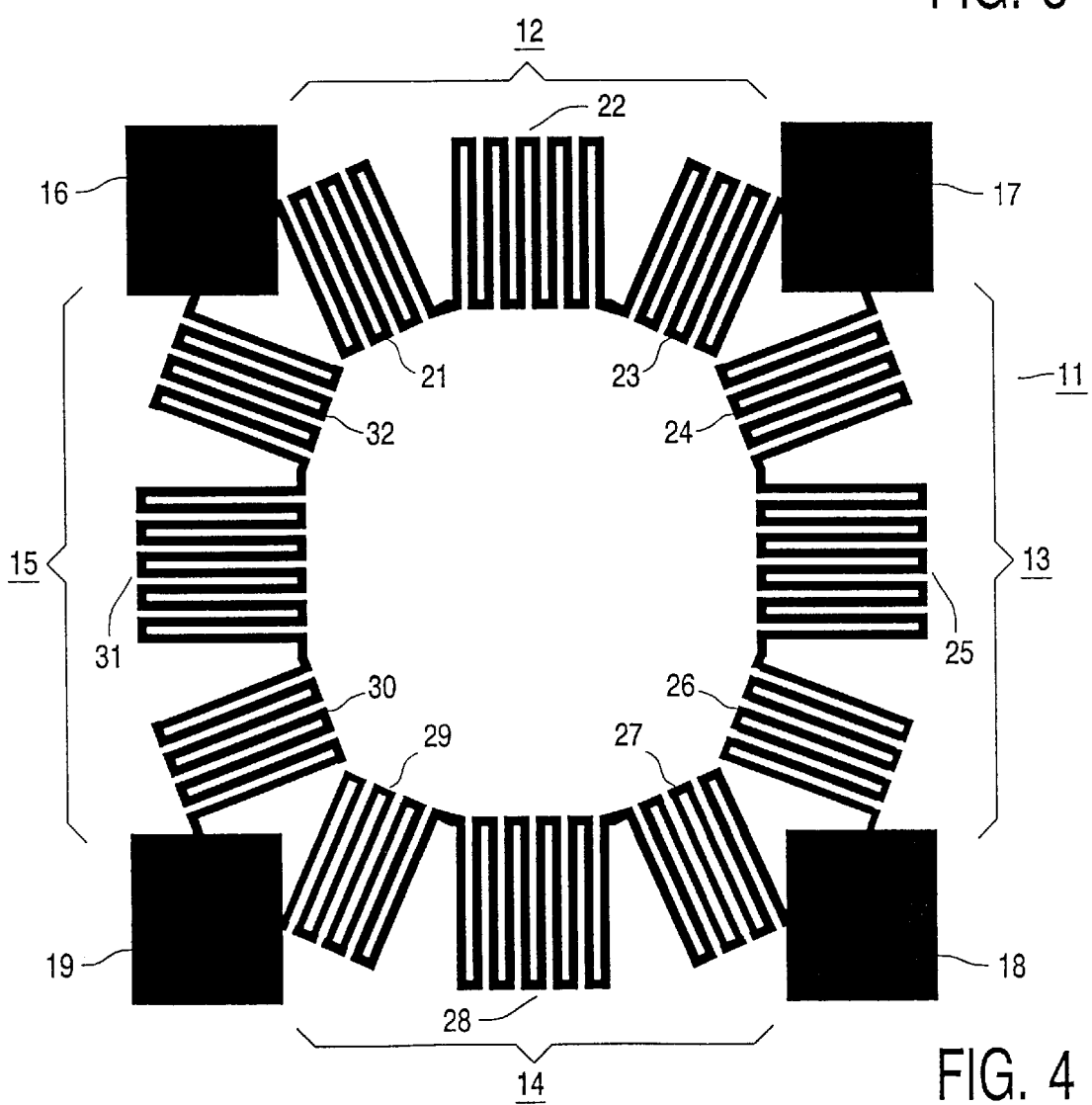
FIG. 4 shows an AMR angular sensor arrangement applied in a Wheatstone bridge configuration in accordance with the present invention.

An embodiment of a full AMR Wheatstone bridge 11 is shown in FIG. 4 having four magnetoresistive sensors 12; 13; 14, 15, with main sensing elements 22; 25; 28; 31, respectively, similar to the sensing element 2 described above. Each main sensor element 22; 25; 28; 31, has two correction elements 21, 23; 24, 26; 27, 29; 30, 32, one placed on each side of a main sensing element at an angle thereto, e.g. +/−22.5°. The correction elements 21, 23; 24, 26; 27, 29; 30, 32 may be designed in a similar way to that described for the correction elements 6, 8 described above. Each sensor 12; 13; 14; 15 is made up of three elements, 21, 22, 23; 24, 25, 26; 27, 28, 29; 30, 31, 32, respectively. The connections to the Wheatstone bridge are made via conductive pads 16, 17, 18, 19.

A second and higher order correction can be obtained by adding further correcting elements at, for example, elements at 33.75, 11.25, −11.25, and −33.75 degrees with respect to each main sensing element. Each correction element has an optimized resistance so that these additional correction elements contribute to cancel out the remaining non-linearities.

Figure 5:
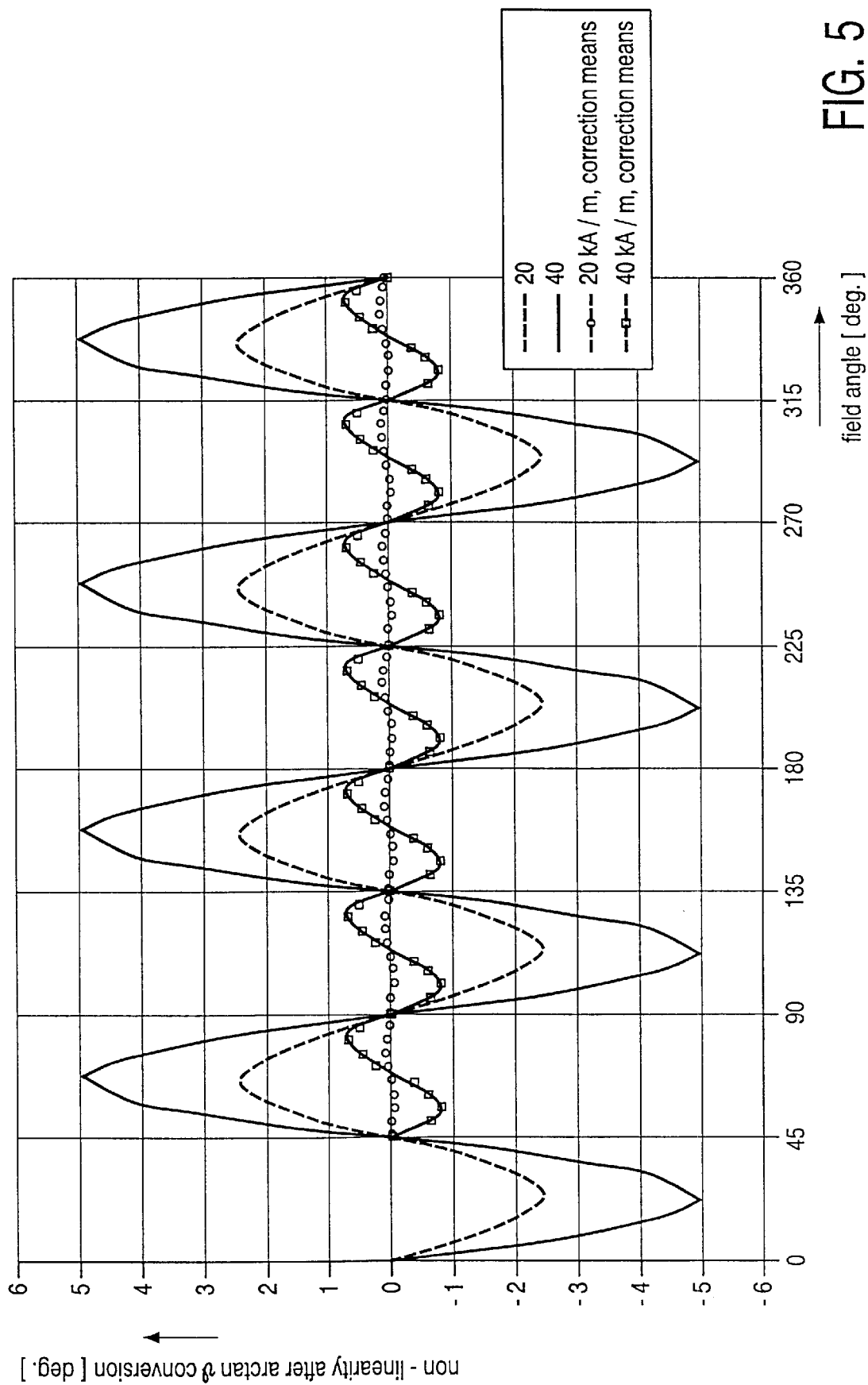
FIG. 5 shows the error signal of two GMR Wheatstone bridge configurations mutually rotated over 90° in comparison with the Wheatstone bridge configurations having correction means in accordance with the present invention.

FIG. 5 shows the degree of non-linearity (i.e. the error signal) measured at two magnetic field strengths (20 kA/m and 40 kA/m) for two conventional GMR Wheatstone bridge type angular sensor devices positioned under 90° relative to each other. The non-linearity is defined as the difference between the ratio of the two actual output signals of the two GMR Wheatstone bridge type angular sensor devices and the best fitting straight line after arctanΘ conversion. The error signal is calculated therefore by subtracting the output from the best-fit straight line. It can be seen that the degree of non-linearity reduces for stronger magnetic fields (dotted line compared to full line). The non-linearity of the output signal of the two non-corrected GMR Wheatstone bridge type angular sensor devices positioned under 90° relative to each other is roughly sinusoidal with a period of 90° degrees which is a quarter of the periodicity of the output signal of one GMR Wheatstone bridge type angular sensor device. In accordance with an embodiment of the sensor according to the present invention, a first order correction is obtained by using a main sensing element and two correction elements in series therewith, where the pinned layer or the pinned AAF of the correction elements has a bias magnetization direction at an angle Θ to that of the main correction element. For example, the bias angle is substantially half that of the periodicity of the error signal, that is −45 and 45 degrees with respect to the main sensing element. The resistance of each correction element is optimized, e.g. a resistance value equal to $1/\sqrt{2}$ of the resistance value of the main sensing element. The principle of operation of this sensor is similar to that shown in FIG. 3, i.e. the contribution to the output of the total sensor 1 provided by the correction elements is such as to cancel at least a portion of the non-linearity in the signal. In FIG. 5 the reduction of the non-linearity by this correction method is shown for two different magnetic fields. The correction sensing elements at least partly eliminate the error in the measured angle to below +/−1°.

Figure 6:
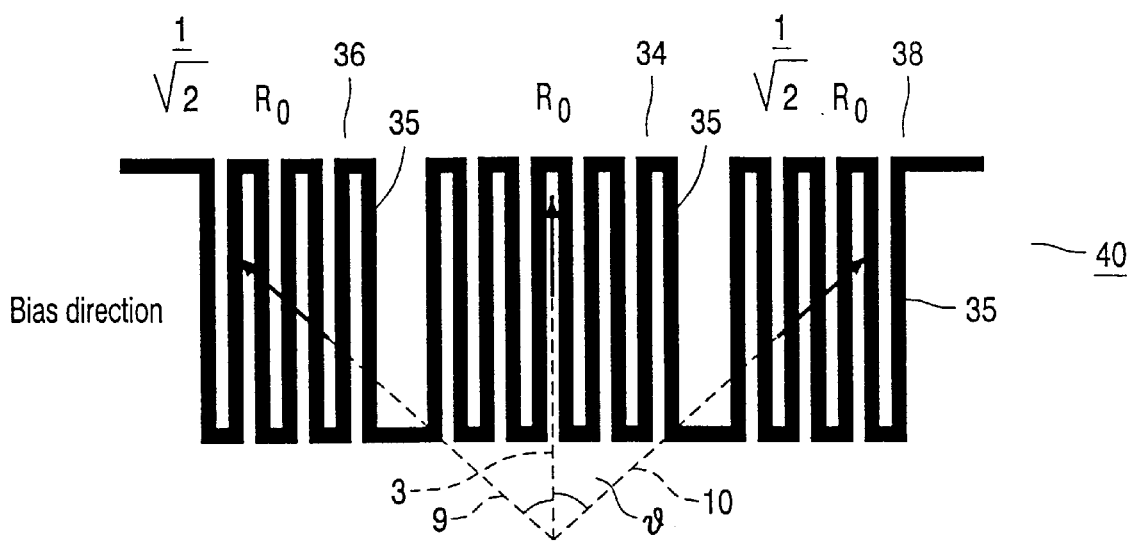
FIG. 6 shows a GMR embodiment of the sensor according to the present invention.

FIG. 6 shows a GMR angular sensor 40 being an embodiment of the sensor according to the present invention comprising a single GMR main sensing element 34 together with two correction elements 36, 38 placed on each side thereof. The arrows shown in FIG. 6 indicate the bias directions of the three elements 34, 36, 38, induced by the AF layers or AAF. Each element 34, 36, 38 comprises elongate multilayer strips 35 formed as a 180° meander. Note that because the elements 34, 36, 38 are arranged in a straight line the angle Θ between the bias magnetization directions of the main element 34 and of the correction elements is 45°. Hence, the present invention includes not only placing correction sensors physically at an angle to the main sensing element but also altering the bias magnetization directions of the correction elements to achieve the same effect, or combinations of these.

A higher order correction can be obtained by adding further correction elements with bias magnetization directions at intermediate angles, e.g. +/−22.5°.

Figure 7:
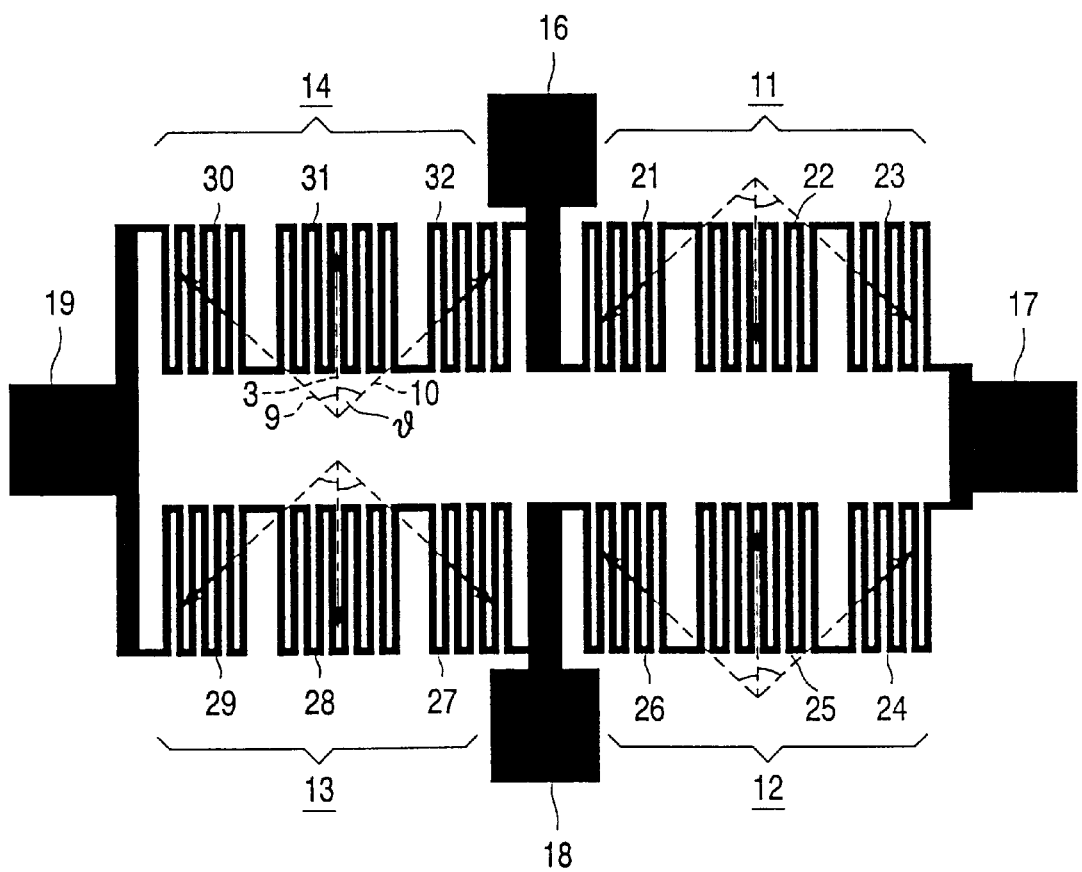
FIG. 7 shows a GMR angular sensor arrangement applied in a Wheatstone bridge configuration in accordance with the present invention.

FIG. 7 shows a further embodiment of the sensor arrangement according to present invention suitable for use as a GMR Wheatstone bridge with first order correction. The device has four sensors 11; 12; 13; 14, with main sensing elements 22; 25; 28; 31, respectively, similar to the sensing element 34 described above. Each main sensing element 22; 25; 28; 31, has two correction elements 21, 23; 24, 26; 27, 29; 30, 32, one placed on each side of a main sensing element, whereby the bias magnetization direction of the correction elements is at an angle to the bias magnetizing direction of the main sensing elements, e.g. +/−45°. The correction elements 21, 23; 24, 26; 27, 29; 30, 32 may be constructed in a similar way to that described for the correction elements 36, 38 described above. Each sensor 11; 12; 13; 14 is made up of three elements, 21, 22, 23; 24, 25, 26; 27, 28, 29; 30, 31, 32, respectively. The connections to the Wheatstone bridge are made via conductive pads 16, 17, 18 and 19. The advantage of a Wheatstone bridge configuration is that the output signal is larger than the output signal of one sensor 1 and that the signal to noise ratio is improved.

For AMR sensors, it is relatively simple to add additional correction elements with reference directions rotated over any suitable angle. Only the mask design used for deposition of the ferromagnetic layers has to be changed to incorporate this correction.

For GMR or TMR sensors with pinned layers it is more difficult to define different bias directions on one sensor chip. In sensors biased by Ir—Mn, the bias direction can be defined during deposition. However, it is difficult to impose six different magnetic field directions to a small sensor chip simultaneously. After deposition, the bias direction can be changed if the elements are heated above the blocking temperature of the exchange biasing. By selective heating of single elements in a sufficiently strong magnetic field the bias direction of each element can be set in any direction. Selective heating can be done by sending a large current through selected elements, by laser heating or by other ways of selectively heating localized spots on a wafer using light.

Figure 8:
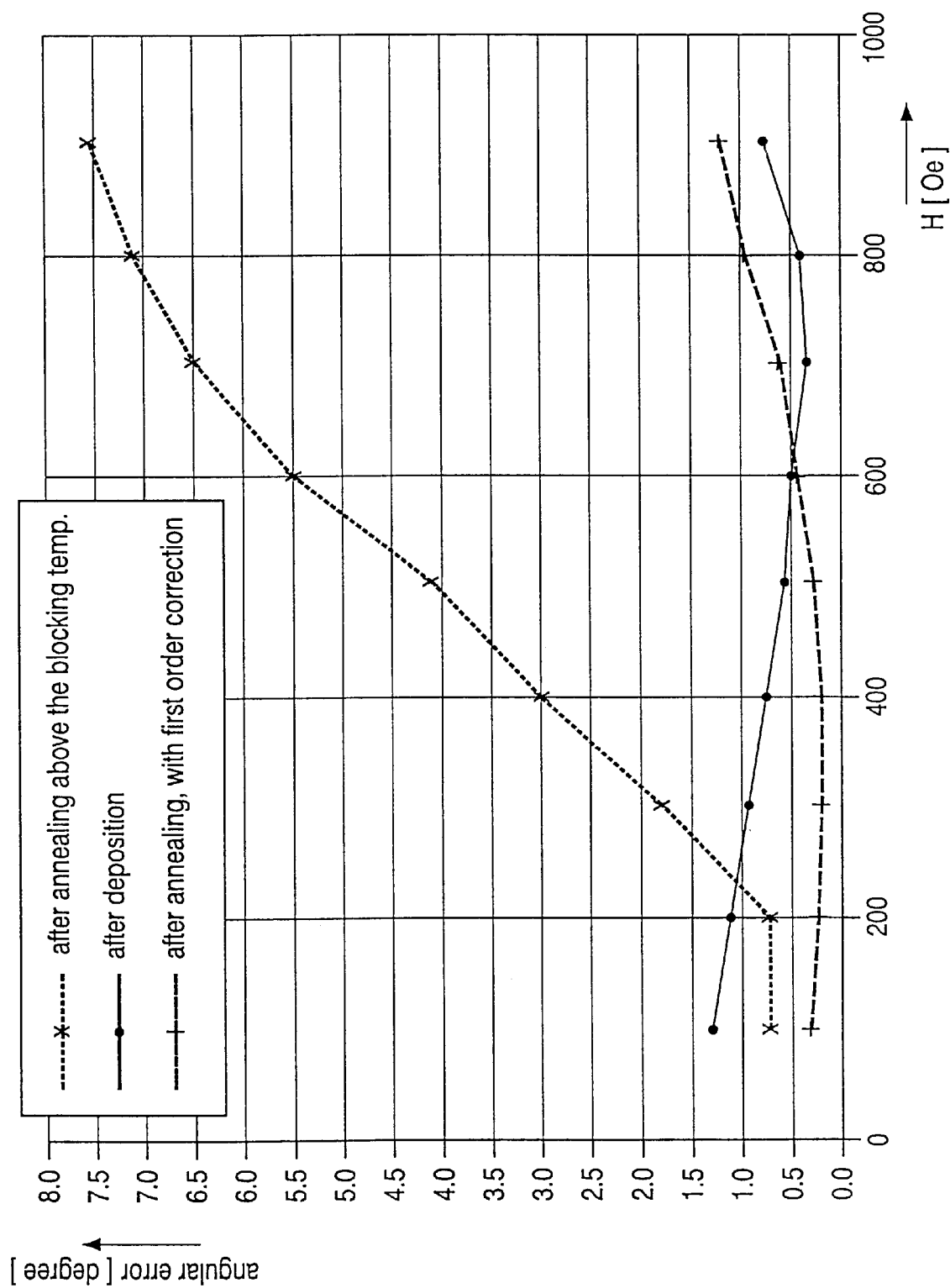
FIG. 8 shows the angular error for a GMR main sensing element immediately after deposition, the main sensing element after annealing and an embodiment of the sensor in accordance with the present invention after annealing as a function of a magnetic field strength.

An alternative method is to use the dispersion that is present in some ferromagnetic layers when they are deposited on an anti ferromagnetic (AF) layer in a magnetic field, which is especially large when the ferromagnetic layer is thin (<2–3 nm). The average bias direction of these layers is in the direction of the magnetic field but the dispersion causes the bias directions on a microscopic scale to spread over an angular range that increases with decreasing thickness of the ferromagnetic layer. A dispersion well over +/−45 degrees has a similar effect as the correction scheme using additional GMR elements with discrete bias directions as can be seen in FIG. 8. The dispersion reduces the maximum GMR effect.

While the invention has been shown and described with reference to preferred embodiments, it will be understood by those skilled in the art that various changes or modifications in form and detail may be made without departing from the scope and spirit of this invention.

What is claimed is:

1. A sensor arrangement including a first and a second magnetoresistive sensor (1), comprising a main sensing element (2) with a main reference magnetization axis (3), for determining an angle between the main reference magnetization axis (3) and a magnetic field direction, characterized in that the main sensing element (2) is electrically connected to a first correction sensing element (6) with a first reference magnetization axis (9) and a second correction sensing element (8) with a second reference magnetization axis (10), the first (9) and the second (10) reference magnetization axes making correction angles Θ between 5° and 85° of opposite sign with the main reference axis (3), and in that the main reference magnetization axis (3) of the second sensor is rotated over a quarter period of a periodic output signal of the main sensing element of he first sensor and the correction angles being ⅛ period for each correction sensing element.

2. A sensor arrangement according to claim 1, characterized in that the first and the second correction sensing elements (6,8) have a resistance value of substantially $1/\sqrt{2}$ times the resistance of the ma n sensing elements.

3. A sensor as claimed in claim 1, comprising additional sensing elements of the same type as the first and second correction sensing elements (6,8), the additional sensing elements having a reference magnetization axis making angles of opposite sign with respect to the main reference magnetization axis of substantially n.¹⁄₁₆ of the periodic output signal of the first main sensor (1), n being an integer.

4. A sensor arrangement comprising four magnetoresistive sensors (1) of the type defined in claim 1, incorporated in a Wheatstone bridge configuration.

5. A method of manufacturing a magnetoresistive sensor of the type defined in claim 1, according to which method all of the sensing elements (2,6,8) are sputter deposited on a single substrate and the angles Θ between the reference magnetization axes (9,10) of the first and the second correction sensing elements (6,8) and the main reference magnetization axis (3) are formed by patterning the sputtered material.

6. A method as claimed in claim 5, characterized in that the angle Θ between the main reference magnetization axis (3) and the reference magnetization axis (9,10) of the first and the second correction sensing elements (6, 8) is formed by locally and individually heating the first and the second sensing elements (6, 8) in a biasing magnetic field having the same direction as the correction angle Θ between the main reference magnetization axis (3) and the reference magnetization axis (9,10) for the first correction sensing element (6) and the second correction sensing element (8).

7. A method as claimed in claim 6, characterized in that the local heating is done by passing an electric current through the first correction sensing element (6) or the second correction sensing element (8).

8. A method as claimed in claim 7, characterized in that the heating is done by means of a laser.

* * * * *